(12) United States Patent
Lee et al.

(10) Patent No.: US 12,463,656 B2
(45) Date of Patent: Nov. 4, 2025

(54) CURRENT-TO-DIGITAL CONVERTER WITH WIDE DYNAMIC RANGE

(71) Applicant: Daegu Gyeongbuk Institute of Science and Technology, Daegu (KR)

(72) Inventors: Jung Hyup Lee, Daegu (KR); Tae Ryoung Seol, Gwangju (KR); Ji Woong Choi, Seoul (KR)

(73) Assignee: Daegu Gyeongbuk Institute of Science and Technology, Daegu (KR)

( * ) Notice: Subject to any disclaimer, the term of this patent is extended or adjusted under 35 U.S.C. 154(b) by 105 days.

(21) Appl. No.: 18/584,598

(22) Filed: Feb. 22, 2024

(65) Prior Publication Data

US 2024/0291500 A1 Aug. 29, 2024

(30) Foreign Application Priority Data

Feb. 23, 2023 (KR) .................. 10-2023-0024622
Jan. 30, 2024 (KR) .................. 10-2024-0014302

(51) Int. Cl.
*H03M 1/48* (2006.01)
*H03M 1/46* (2006.01)
*H03M 3/00* (2006.01)

(52) U.S. Cl.
CPC ............. *H03M 1/48* (2013.01); *H03M 1/46* (2013.01); *H03M 3/424* (2013.01); *H03M 3/454* (2013.01)

(58) Field of Classification Search
CPC .......... H03M 1/48; H03M 1/46; H03M 3/424; H03M 3/454
USPC ........................................ 341/139, 143, 155
See application file for complete search history.

(56) References Cited

U.S. PATENT DOCUMENTS

| | | | | |
|---|---|---|---|---|
| 7,880,654 | B2* | 2/2011 | Oliaei | H03M 3/374 |
| | | | | 341/143 |
| 10,581,453 | B1* | 3/2020 | Ganta | H03M 3/464 |
| 10,979,069 | B2* | 4/2021 | Lo | H03M 3/464 |

FOREIGN PATENT DOCUMENTS

KR 10-2023-0122973 A 8/2023

OTHER PUBLICATIONS

Chung-Lun Hsu, et al., "A Current-Measurement Front-End with 160dB Dynamic Range and 7ppm INL," ISSCC 2018, Session 19, Sensors and Interfaces, 19.5, ISSCC Dig. Tech. Papers, Feb. 2018, pp. 326-328.

* cited by examiner

*Primary Examiner* — Khai M Nguyen
(74) *Attorney, Agent, or Firm* — Sughrue Mion, PLLC

(57) ABSTRACT

The present invention relates to a current-to-digital converter and the current-to-digital converter according to an example embodiment includes an integrator connected to a current source that outputs input current; a quantizer connected to the integrator and configured to generate a first digital output code corresponding to alternating current (AC) in the input current; a first loop circuit formed on a delta-sigma (ΔΣ) loop that connects an input terminal of the integrator and an output terminal of the quantizer; a second loop circuit formed on a truncation-noise-shaped baseline-servo (TNS-BS) loop that connects the input terminal of the integrator and the output terminal of the quantizer and configured to generate a second digital output code corresponding to direct current (DC) in the input current; and an adder configured to generate a final digital output code by adding the first digital output code and the second digital output code.

9 Claims, 14 Drawing Sheets

630

910

CURRENT-TO-DIGITAL CONVERTER WITH WIDE DYNAMIC RANGE

TECHNICAL FIELD

The present invention relates to a current-to-digital converter, and more particularly, to technical spirit that implements a current-to-digital converter having a wide input range with low power.

RELATED ART

Current readout in a biosensor based on an amperometric front-end fabricated with complementary metal-oxide semiconductor (CMOS) technology is widely used in various applications to provide analytical details about biological interaction between receptors and target analytes and, particularly, is mainly used to provide recorded signals in applications, such as medical care and disease diagnosis.

Also, with the current expanding spread of smartphones and smartwatches, wearable biosensors for healthcare monitoring are attracting attention. In particular, research is being actively conducted on more compact and user-friendly biosensors that may be applied to watch bands, patches, and contact lenses.

For a current signal provided from this wearable sensor, a current-to-digital converter (IDC) fabricated in a CMOS process is utilized to digitize an analog current signal since it may be integrated into the CMOS process that meets the stringent area requirements of small wearable sensors.

Since a typical wearable sensor operates on a small battery, the current-to-digital converter needs to be able to withstand a wide input current range of 100 µA or more without saturation while consuming less power. When measuring current signals from different analytes, using a single current-to-digital converter with a very high dynamic range (DR) (120 dB or more) capable of measuring a plurality of analytes is advantageous for device miniaturization and power consumption minimization, rather than using a plurality of current-to-digital converters.

Therefore, to secure the high dynamic range, the conventional current-to-digital converter applies a structure based on a prediction digital-to-analog (DAC) as shown in (a) of FIG. 1, a current-splitting DAC as shown in (b) of FIG. 1, and a structure based on a threshold-filter loop as shown in (c) of FIG. 1.

In detail, the prediction DAC mainly uses an asynchronous switching device, called an hourglass analog-to-digital converter (hourglass ADC), for current-to-digital conversion.

Here, the hourglass ADC continuously converts a direction of integrated input current using an asynchronous comparator and outputs a frequency of this converted signal as digital output.

Here, the feedback-type hourglass ADC is a type of first-order delta-sigma ADC and may achieve high resolution within a signal band with a first-order quantization noise-shaping characteristic and also achieve a wide dynamic range through a dynamic range extension process.

However, since digital blocks used to expand the dynamic range have great power consumption and very high complexity, the hourglass ADC may be implemented through an external field-programmable gate array (FPGA) rather than on-chip. Therefore, there is a limitation that it is very difficult to integrate into a small-sized system on chip (SoC).

Meanwhile, a current-splitting DAC effectively changes system gain, but needs to manually adjust reference current and accordingly, has a limitation that it is difficult to use for long-term monitoring. A threshold-filter loop may be used in conjunction with a noise-shaping dual-slope ADC to expand the dynamic range using a very efficient method and low power. However, the ADC itself has a limitation of being band-limited (~20 Hz).

RELATED ART DOCUMENTS

Patent Document (Patent document 1) Korean Patent Laid-Open Publication No. 10-2023-0122973, "continuous time delta-sigma analog-to-digital converter (ADC) and operating method thereof."

Non-Patent Document (Non-patent document 1) C.-L. Hsu, et al. "A current-measurement front-end with 160 dB dynamic range and 7 ppm INL", ISSCC Dig. Tech. Papers, pp. 326-328, February 2018.

DETAILED DESCRIPTION

Subject

The present invention provides a current-to-digital converter that may expand the dynamic range while having small power consumption and low complexity compared to the existing technology.

Also, the present invention provides a current-to-digital converter that may more efficiently expand the dynamic range through a secondary delta-sigma analog-to-digital converter (ADC) and a truncation-noise-shaped baseline-servo (TNS-BS) loop with low power consumption and low complexity.

Solution

A current-to-digital converter according to an example embodiment of the present invention may include an integrator connected to a current source that outputs input current; a quantizer connected to the integrator and configured to generate a first digital output code corresponding to alternating current (AC) in the input current; a first loop circuit formed on a delta-sigma (ΔΣ) loop that connects an input terminal of the integrator and an output terminal of the quantizer; a second loop circuit formed on a truncation-noise-shaped baseline-servo (TNS-BS) loop that connects the input terminal of the integrator and the output terminal of the quantizer and configured to generate a second digital output code corresponding to direct current (DC) in the input current; and an adder configured to generate a final digital output code by adding the first digital output code and the second digital output code.

According to an aspect, the first loop circuit may include a first resistive digital-to-analog converter (RDAC) connected to the input terminal of the integrator, a dynamic-element-matching (DEM) circuit connected to the first RDAC and the output terminal of the quantizer, and a first decoder connected to the first RDAC.

According to an aspect, the first RDAC may be a tri-level RDAC and the first decoder may be a tri-level decoder.

According to an aspect, the second loop circuit may include a second RDAC connected to the input terminal of the integrator and a truncation-noise-shaped low pass filtering (TNS-LPF) circuit connected to the second RDAC and the output terminal of the quantizer.

According to an aspect, the TNS-LPF circuit may include a second decoder connected to the second RDAC, a $1^{st}$ order digital truncator connected to the second decoder, and a digital integrator connected to the $1^{st}$ order digital truncator and the output terminal of the quantizer, and may be configured to output the second digital output code through an output node provided between the second decoder and the $1^{st}$ order digital truncator.

According to an aspect, the second RDAC may be a tri-level reset-then-open RDAC (RTO-RDAC), and the second decoder may include a tri-level decoder and a reset-then-open (RTO) logic.

According to an aspect, the integrator may be an integrator based on a local feedback structure.

According to an aspect, the quantizer may be a body-driven voltage-controlled oscillator (VCO)-based quantizer.

According to an aspect, the first loop circuit may be connected to the output terminal of the quantizer and thereby, connected to a second node provided at an output terminal of a subtractor that outputs the first digital output code to the adder, and the second loop circuit may be connected to a first node provided between the output terminal of the quantizer and an input terminal of the subtractor.

Effect

According to an example embodiment, the present invention may expand the dynamic range while having small power consumption and low complexity compared to the existing technology.

Also, the present invention may more efficiently expand the dynamic range through a secondary delta-sigma analog-to-digital converter (ADC) and a truncation-noise-shaped baseline-servo (TNS-BS) loop with low power consumption and low complexity.

MODE

Figure 1:
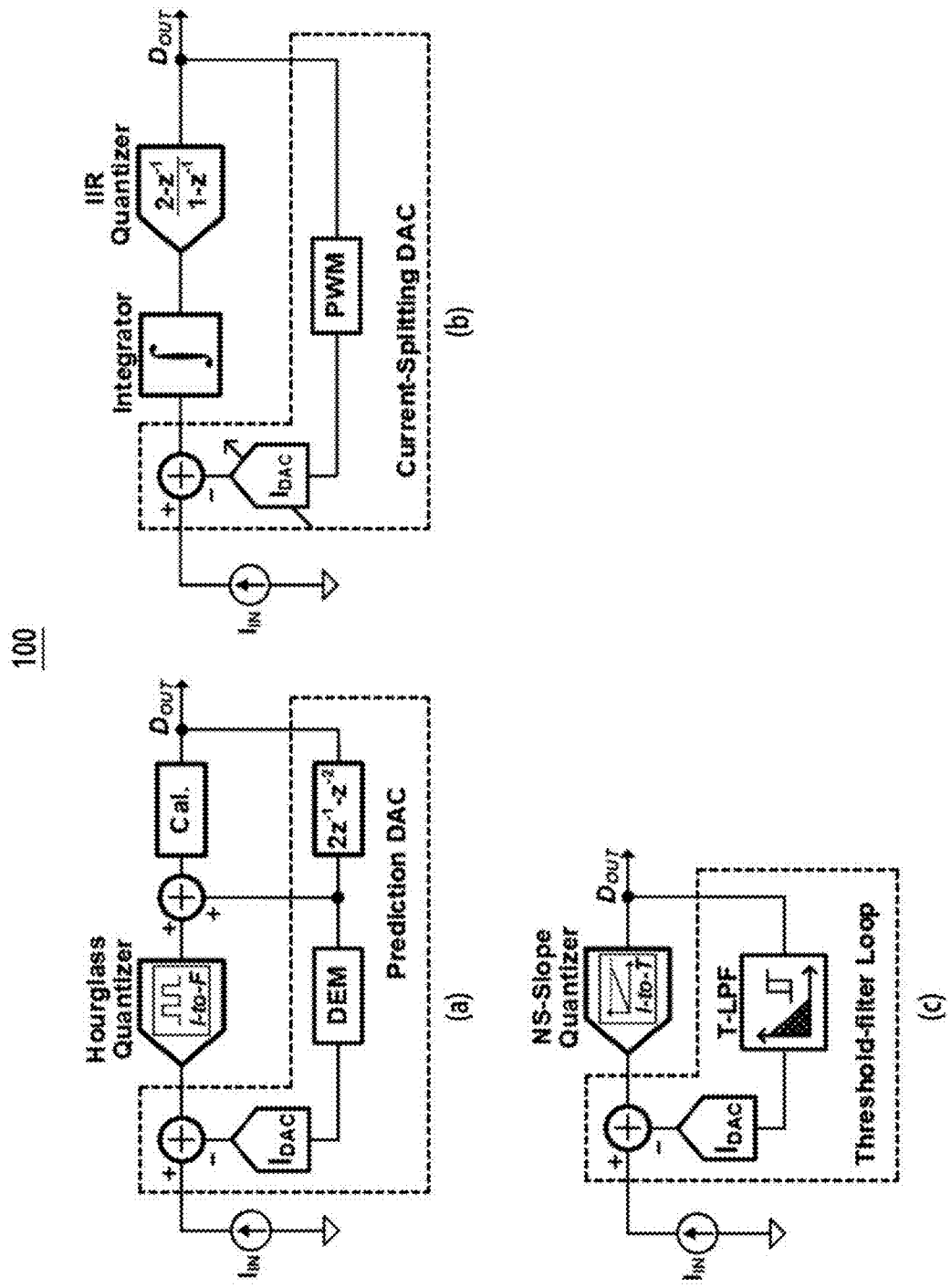
FIG. 1 illustrates a current-to-digital converter according to the related art.

Hereinafter, various example embodiments will be described with reference to the accompanying drawings.

The example embodiments and the terms used herein are not construed to limit technology described herein to specific implementations and should be understood to include various modifications, equivalents, and/or substitutions of corresponding example embodiments.

When it is determined that detailed description related to a relevant known function or configuration may make the disclosure unnecessarily ambiguous in describing various example embodiments in the following, the detailed description will be omitted.

The following terms refer to terms defined in consideration of functions of various example embodiments and may differ depending on a user, the intent of an operator, or custom.

Accordingly, the terms should be defined based on the overall contents in the present specification.

In relation to explaining drawings, like reference numerals refer to like elements.

The singular forms "a," "an," and "the" are intended to include the plural forms as well, unless the context clearly indicates otherwise.

Herein, expressions, such as "A or B" and "at least one of A and/or B," may include all possible combinations of listed items.

Expressions, such as "first," "second," etc., may describe corresponding components regardless of order or importance and may be simply used to distinguish one component from another component and do not limit the corresponding components.

When it is described that one (e.g., first) component is "(functionally or communicatively) connected" or "accessed" to another (e.g., second) component, the component may be directly connected to the other component or may be connected thereto through still another component (e.g., third component).

Herein, "configured (or set) to ~" may be interchangeably used with, for example, "suitable for ~," "having capability of ~," "changed to ~," "made to ~," "capable of ~," or "designed to ~" in a hardware manner or a software manner, depending on situations.

In a situation, the expression "device configured to ~" may represent that the device is "capable of" interworking with another device or parts.

For example, the phrase "processor configured (or set) to perform A, B, and C" may refer to a dedicated processor (e.g., embedded processor) for performing a corresponding operation or a general-purpose processor (e.g., central processing unit (CPU) or application processor) capable of performing corresponding operations by executing one or more software programs stored in a memory device.

Also, the term "or" represents "inclusive or" rather than "exclusive or."

That is, unless otherwise stated or clear from the context, the expression "x uses a or b" represents any one of natural inclusive permutations.

In the detailed example embodiments, a component included in the invention is expressed as the singular form or the plural form depending on detailed example embodiments.

However, singular or plural expressions are selected to suit the presented situation for clarity of description and the example embodiments are not limited to singular or plural components. Also, even components expressed in the plural form may be configured in the singular form, or even components expressed in the singular form may be configured in the plural form.

Meanwhile, although the description of the invention describes specific example embodiments, it will be apparent that various modifications may be made without departing from the scope of the technical spirit of various example embodiments.

Therefore, the scope of the present invention should not be limited to the example embodiments and should be defined by the claims and the equivalents thereto.

Figure 2:
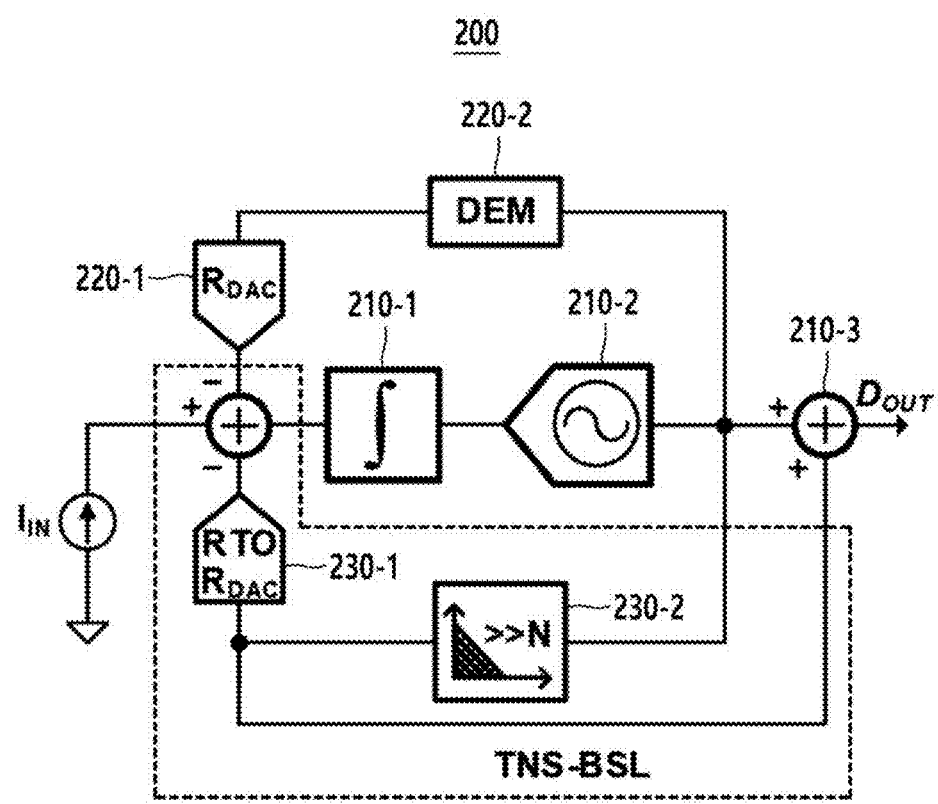
FIG. 2 illustrates a current-to-digital converter according to an example embodiment.

FIG. 2 illustrates a current-to-digital converter according to an example embodiment.

Referring to FIG. 2, a current-to-digital converter 200 according to an example embodiment may expand the dynamic range while having small power consumption and low complexity compared to the existing technology.

Also, the current-to-digital converter 200 may more efficiently expand the dynamic range with a secondary delta-sigma ($\Delta\Sigma$) analog-to-digital converter (ADC) having high resolution and a truncation-noise-shaped baseline-servo (TNS-BS) loop having small power consumption and low complexity.

In detail, the current-to-digital converter 200 may be designed to have a bandwidth of 4 kHz and the dynamic rang of 136.6 dB at supply voltage of 1V. When a peak signal-to-noise and distortion ratio (SNDR) input is applied, the power of 64.1 µW may be consumed. When 200 µA that is the maximum input range higher than the existing technology by 20 times is applied, the power of 260.4 µW may be consumed.

To this end, the current-to-digital converter 200 may include a secondary delta-sigma ADC that includes an integrator 210-1, a quantizer 210-2, and a first loop circuit (220-1, 220-2), and a truncation-noise-shaped baseline-servo (TNS-BS) loop that includes an adder 210-3 and a second loop circuit (230-1, 230-2).

The integrator 210-1 according to an example embodiment may be connected to a current source that outputs input current ($I_{IN}$). Desirably, the integrator 210-1 may be an integrator based on a local feedback structure.

The quantizer 210-2 according to an example embodiment may be connected to the integrator 210-1, and may generate a first digital output code ($D_{AC\_OUT}$) corresponding to alternating current (AC) ($I_{AC}$) in the input current ($I_{IN}$). Desirably, the quantizer 210-2 may be a body-driven voltage-controlled oscillator (VCO)-based quantizer.

The first loop circuit (220-1, 220-2) may be formed on a delta-sigma ($\Delta\Sigma$) loop that connects an input terminal of the integrator 210-1 and an output terminal of the quantizer 210-2.

According to an aspect, the first loop circuit (220-1, 220-2) may include a first resistive digital-to-analog converter ($R_{DAC}$) 220-1 connected to the input terminal of the integrator 210-1, a dynamic-element-matching (DEM) circuit 220-2 connected to the first $R_{DAC}$ and the output end of the quantizer, and a first decoder connected to the first RDAC 220-1.

Here, the RDAC refers to a device that includes a plurality of resistors corresponding to digital bits representing a binary weight and converts a digital input code to an analog signal (analog current or voltage). Desirably, the first RDAC 220-1 may be a tri-level RDAC and the first decoder may be a tri-level decoder.

Also, the DEM circuit 220-2 may be a data-weighted-averaging (DWA) circuit.

Here, the DWA circuit refers to a circuit that calculates a weighted average by assigning weights to various data inputs and may assign greater importance to data with high reliability by differently setting a weight according to the reliability of data.

For example, the DWA circuit may assign a high weight to data with high reliability and may assign a low weight to data with low reliability by assigning a weight (reliability of corresponding data) to each data input and by combining data using the weights.

The second loop circuit (230-1, 230-2) according to an example embodiment may be formed on the truncation-noise-shaped baseline-servo (TNS-BS) loop that connects the input terminal of the integrator 210-1 and the output terminal of the quantizer 210-2 and may generate a second digital output code ($D_{DC\_OUT}$) corresponding to DC in the input current ($I_{IN}$).

According to an aspect, the second loop circuit (230-1, 230-2) may include a second RDAC 230-1 connected to the input terminal of the integrator 210-1 and a truncation-noise-shaped low pass filtering (TNS-LPF) circuit 230-2 connected to the second RDAC 230-1 and the output terminal of the quantizer 220-2. Desirably, the second RDAC 230-1 may be a tri-level reset-then-open RDAC (RTO-RDAC).

According to an aspect, the TNS-LPF circuit 230-2 may include a second decoder connected to the second RDAC 230-1, a $1^{st}$ order digital truncator connected to the second decoder, and a digital integrator connected to the $1^{st}$ order digital truncator and the output terminal of the quantizer 210-2.

Also, the TNS-LPF circuit 230-2 may output the second digital output code ($D_{DC\_OUT}$) through an output node provided between the second decoder and the $1^{st}$ order digital truncator. Desirably, the second decoder may include a tri-level decoder and a reset-then-open (RTO) logic.

Here, the digital truncator refers to a digital processing circuit that truncates a signal by lowering precision of a digital signal or by removing a specific bit or more and may process output of an ADC to limit the same to the desired number of bits. Through this, it is possible to reduce a data size and to control a bandwidth required for storage or transmission.

Also, the reset-then-open (RTO) logic refers to a logic that performs stable initialization used in a digital system and may operate in a manner of initially applying a reset signal when initializing a device and then turning off (opening) the reset signal when initialization is completed, thereby securing stability and reliability.

Meanwhile, the first loop circuit (220-1, 220-2) may be connected to the output terminal of the quantizer 210-2 and connected to a second node provided at an output terminal of a subtractor that outputs the first digital output code ($D_{AC\_OUT}$) to the adder 210-3 and the second loop circuit (230-1, 230-2) may be connected to a first node provided between the output terminal of the quantizer 210-2 and an input terminal of the subtractor.

The adder 210-3 according to an example embodiment may generate a final digital output code ($D_{OUT}$) by adding the first digital output code ($D_{AC\_OUT}$) and the second digital output code ($D_{DC\_OUT}$).

That is, through a process of simply adding the first digital output code ($D_{AC\_OUT}$) and the second digital output code ($D_{DC\_OUT}$), the current-to-digital converter 200 may effectively reduce truncation noise occurring in the truncation-noise-shaped baseline-servo (TNS-BS) loop while maintaining low complexity and low power consumption of the truncation-noise-shaped baseline-servo (TNS-BS) loop. Through this, the dynamic range may be maximized with low complexity and low power compared to the existing technology.

The current-to-digital converter 200 according to an example embodiment will be further described with reference to FIG. 3.

Figure 3:
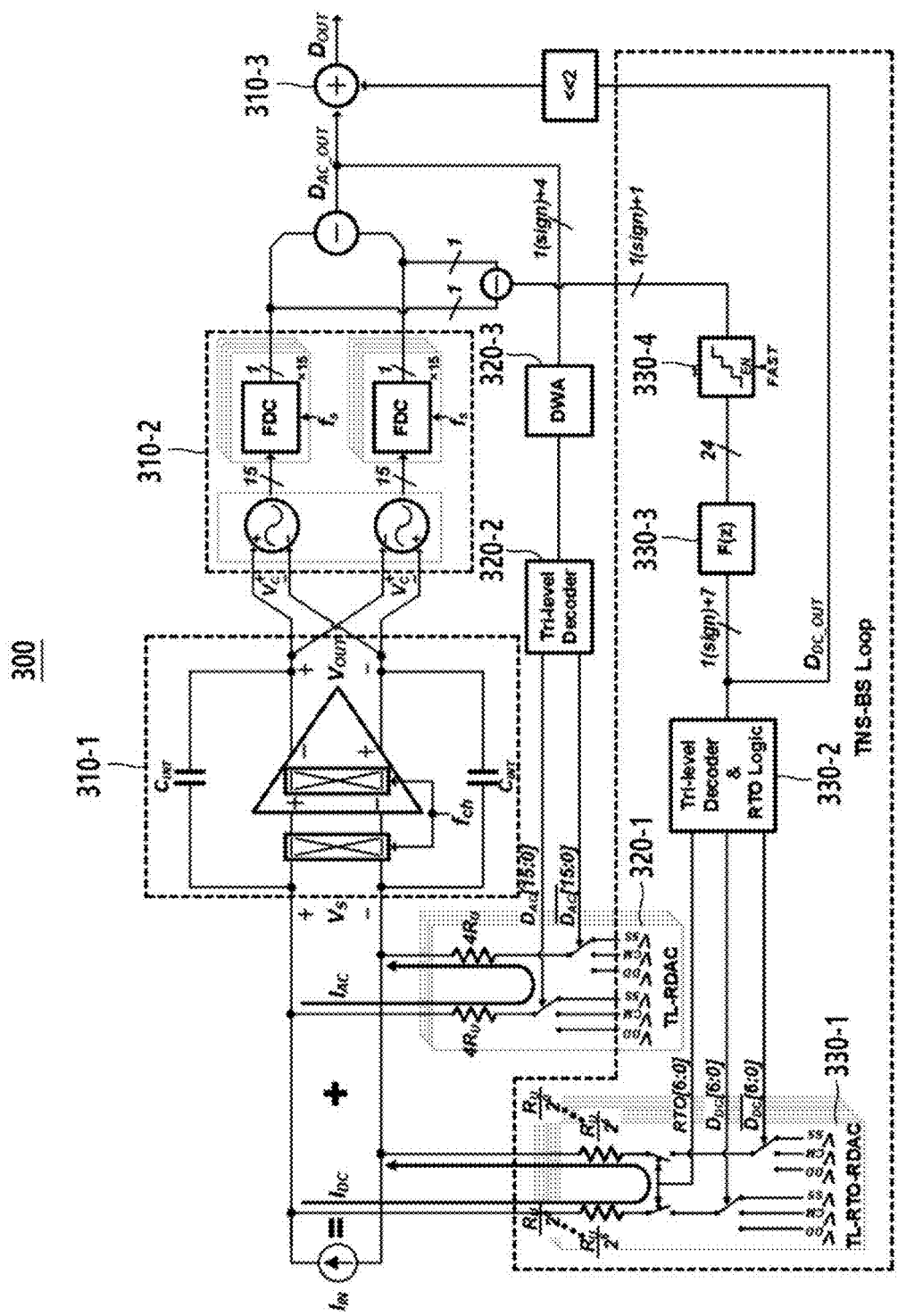
FIG. 3 illustrates an implementation example of a current-to-digital converter according to an example embodiment.

FIG. 3 illustrates an implementation example of a current-to-digital converter according to an example embodiment.

In FIG. 3, $R_U$ represents 300 kΩ, $f_s$ represents 800 kHz, and $f_{ch}$ represents 400 kHz.

However, numerical values of $R_U$, $f_s$, and $f_{ch}$ are not limited thereto and may be easily changed to other values by a user.

Referring to FIG. 3, a current-to-digital converter 300 may include a secondary delta-sigma ADC that includes an integrator 310-1 based on a local feedback structure, a body-driven voltage-controlled oscillator (VCO)-based quantizer 310-2, a tri-level RDAC (TL-RDAC) 320-1 formed on a delta-sigma loop, a tri-level decoder 320-2, and a DWA circuit 320-3. Here, the secondary delta-sigma ADC may generate a first digital output code ($D_{AC\_OUT}$) corresponding to AC ($I_{AC}$) in input current ($I_{IN}$) output from a current source.

The integrator 310-1 may drive the quantizer 310-2 that generates the first digital output code ($D_{AC\_OUT}$) corresponding to the AC ($I_{AC}$) in the input current ($I_{IN}$).

The tri-level RDAC 320-1 may operate based on preset three voltage levels ($V_{DD}$, $V_{SS}$, and $V_{CM}$). This tri-level driving may save power at smaller input due to a zero-current-hold state. Desirably, the tri-level RDAC 320-1 may operate based on $V_{DD}/V_{SS}$ or $V_{CM}$.

The tri-level RDAC 320-1 may serve as a digital control current source that generates fault current for forward integration by subtracting from the input current (Im), and the tri-level decoder 320-2 may serve to control feedback through the tri-level RDAC 320-1.

For example, the tri-level decoder 320-2 may determine the number of active elements based on a least significant bit (LSB) of the first digital output code ($D_{AC\_OUT}$) and may determine whether the active element is driven by VDD or VSS based on a most significant bit (MSB) of the first digital output code ($D_{AC\_OUT}$) and may perform dynamic element matching to minimize the effect of mismatch.

The DWA circuit 320-3 may be connected to the output terminal of the quantizer 310-2 and thereby connected to a second node provided at an output terminal of a subtractor that outputs the first digital output code ($D_{AC\_OUT}$).

In detail, the body-driven VCO-based quantizer 310-2 may provide primary noise-shaping without an additional integrator, allowing the secondary delta-sigma ADC to have a secondary noise-shaping characteristic. Through this, it is possible to minimize occurrence of quantization noise while consuming less power within a signal bandwidth.

Also, the secondary delta-sigma ADC may achieve high linearity using the integrator 310-1 based on the local feedback structure with high linearity, the body-driven VCO-based quantizer 310-2, and the DWA circuit 320-3.

That is, the current-to-digital converter 300 may achieve an ADC with high resolution based on low quantization noise and high linearity.

The current-to-digital converter 300 may include a truncation-noise-shaped baseline-servo (TNS-BS) loop that includes a tri-level reset-then-open RDAC (TL-RTO-RDAC) 330-1, a tri-level decoder and reset-then-open (RTO) logic 330-2, a 1$^{st}$ order digital truncator 330-3, and a digital integrator 330-4. Here, the truncation-noise-shaped baseline-servo (TNS-BS) may generate a second digital output code ($D_{DC\_OUT}$) corresponding to DC ($I_{DC}$) in the input current ($I_{IN}$) output from the current source.

In detail, the truncation-noise-shaped baseline-servo (TNS-BS) loop refers to a loop that serves to track a reference component of the input current ($I_{IN}$) and, more particularly, may serve to track a baseline of the input current ($I_{IN}$) by integrating the output of the quantizer 310-2 using a digital method.

The tri-level decoder and reset-then-open (RTO) logic 330-2 may serve to control feedback through the tri-level reset-then-open RDAC 330-1.

Also, the truncation-noise-shaped baseline-servo (TNS-BS) loop may output the second digital output code ($D_{DC\_OUT}$) through an output node provided between the tri-level decoder and reset-then-open logic 330-2 and the 1$^{st}$ order digital truncator 330-3.

The digital integrator 330-4 may be connected to a first node provided between the output terminal of the quantizer 310-2 and the output terminal of the subtractor that outputs the first digital output code ($D_{AC\_OUT}$). Here, the digital integrator 330-4 may be connected to the first node through an additional subtractor.

An MSB of the digital integrator 330-4 may drive the tri-level reset-then-open RDAC 330-1 and truncation noise according thereto may have a primary noise shape.

In detail, the truncation-noise-shaped baseline-servo (TNS-BS) loop refers to a loop used to expand the dynamic range and may effectively separate baseline signals consuming large power with low complexity from small AC signals through a truncation process. The truncation noise occurring here may achieve a primary noise-shaping characteristic.

Meanwhile, the current-to-digital converter 300 may include an adder 310-3 configured to generate a final digital output code ($D_{OUT}$) by adding the first digital output code ($D_{AC\_OUT}$) and the second digital output code ($D_{DC\_OUT}$).

That is, the adder 310-3 may generate the final digital output code ($D_{OUT}$) corresponding to the input current ($I_{IN}$) by adding the gain-corrected second digital output code ($D_{DC\_OUT}$) to the first digital output code ($D_{AC\_OUT}$). Through this, truncation noise may be effectively reduced.

Figure 4:
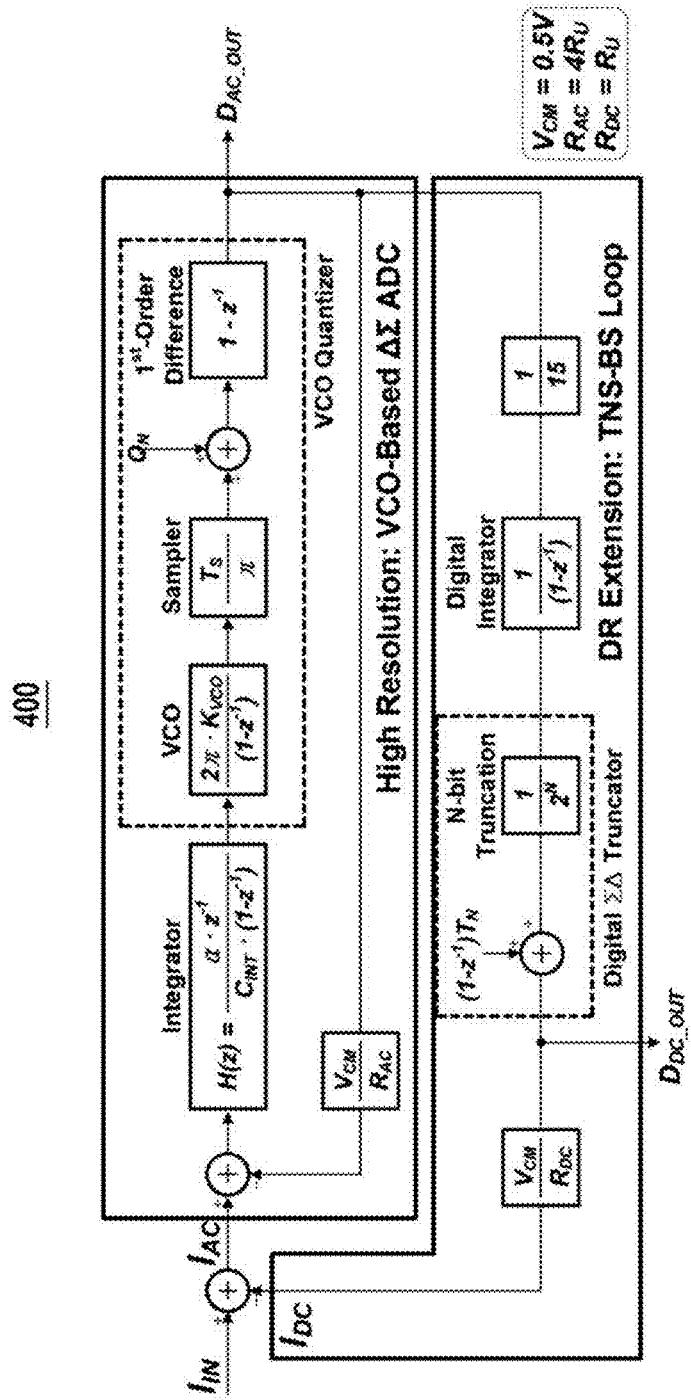
FIGS. 4 and 5 illustrate noise characteristics of a current-to-digital converter according to an example embodiment.
Figure 5:
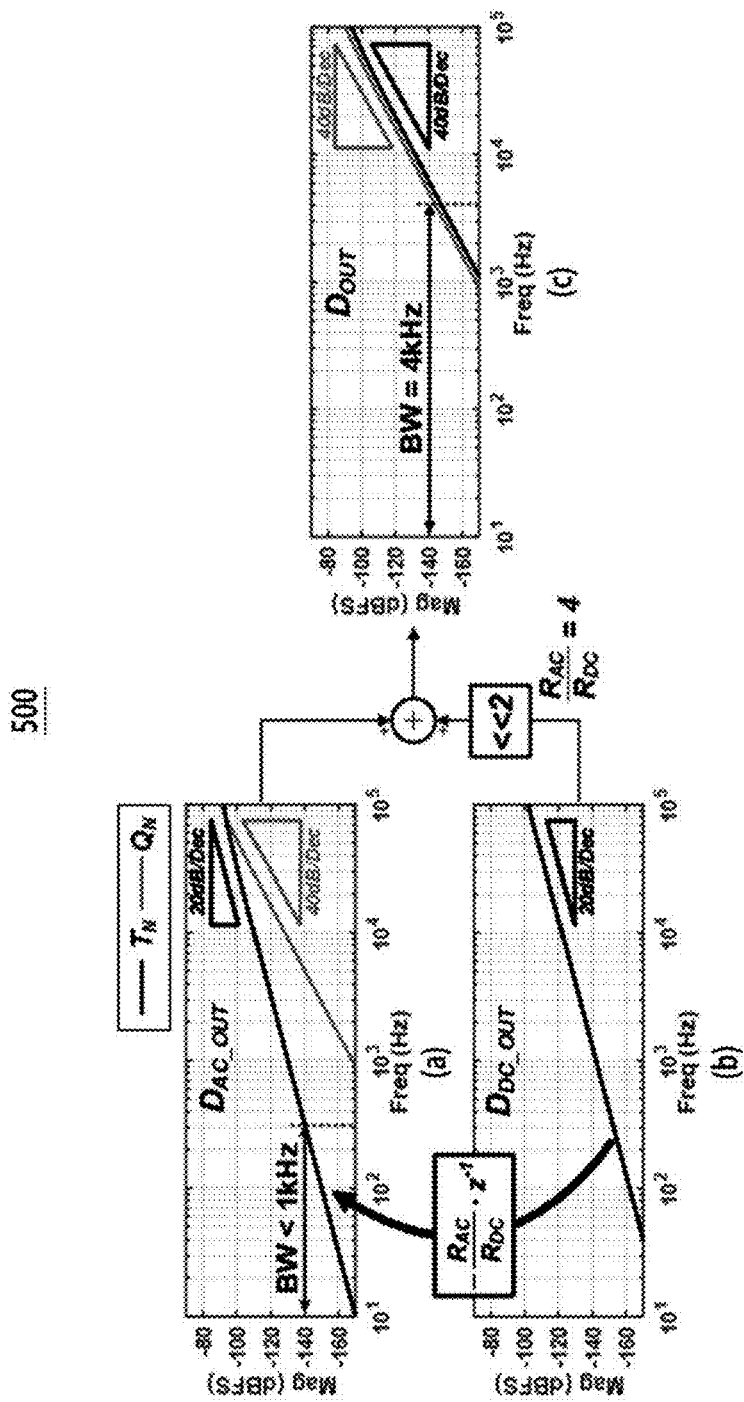

FIGS. 4 and 5 illustrate noise characteristics of a current-to-digital converter according to an example embodiment.

Referring to FIGS. 4 and 5, reference numeral 400 illustrates modeling (z-domain model) results of truncation noise and quantization noise of the current-to-digital converter according to an example embodiment.

Also, reference numeral 500 illustrates noise simulation results for digital output of the current-to-digital converter according to an example embodiment. In more detail, (a) of reference numeral 500 illustrates simulation results of a first digital output code ($D_{AC\_OUT}$), (b) of reference numeral 500 illustrates simulation results of a second digital output code ($D_{DC\_OUT}$), and (c) of reference numeral 500 illustrates simulation results of a final digital output code ($D_{OUT}$).

According to reference numerals 400 and 500, as a result of noise modeling of the current-to-digital converter according to an example embodiment that includes a secondary delta-sigma ADC for implementing high resolution and a truncation-noise-shaped baseline-servo (TNS-BS) loop for expanding the dynamic range (DR), quantization noise ('$Q_N$' in reference numeral 400) may achieve secondary noise-shaping. On the other hand, since truncation noise ('$(1-z^{-1})T_N$' in reference numeral 400) is implemented only up to primary noise-shaping, resolution within the bandwidth of 4 kHz may be greatly limited due to truncation noise in the first digital output code ($D_{AC\_OUT}$).

Therefore, to solve the aforementioned problems, the current-to-digital converter according to an example embodiment may generate an additional differentiator function $(1-z^{-1})$ by simply adding the second digital output code $(D_{DC\_OUT})$ to the first digital output code $(D_{AC\_OUT})$ using the fact that truncation noise in the second digital output code $(D_{DC\_OUT})$ is reflected one clock faster than truncation noise in the first digital output code $(D_{AC\_OUT})$.

Through this, by finally achieving secondary noise shaping for truncation noise that was previously implemented only as primary noise shaping, low noise characteristics may be implemented within the bandwidth of 4 kHz.

In detail, referring to the first digital output code $(D_{AC\_OUT})$ in reference numeral 500, it can be seen that truncation noise severely limits the signal bandwidth to 300 Hz or less that is less than or equal to 10% of secondary noise-shaped quantization noise.

On the contrary, referring to the final digital output code $(D_{OUT})$, it can be seen that truncation noise is lower than quantization noise by simply adding the gain-corrected second digital output code $(D_{DC\_OUT})$ to the first digital output code $(D_{AC\_OUT})$. Here, a gain correction process is $R_{AC}/R_{DC}$ and may be performed by shifting the second digital output code $(D_{DC\_OUT})$ to the left by 2 bits (i.e., '<<2').

Figure 6A:
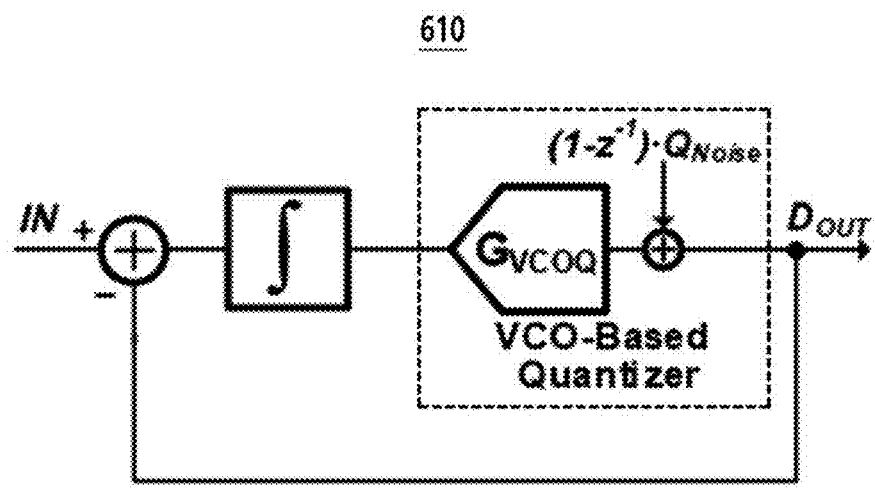
FIGS. 6A to 6C illustrate in more detail a quantizer according to an example embodiment.
Figure 6B:
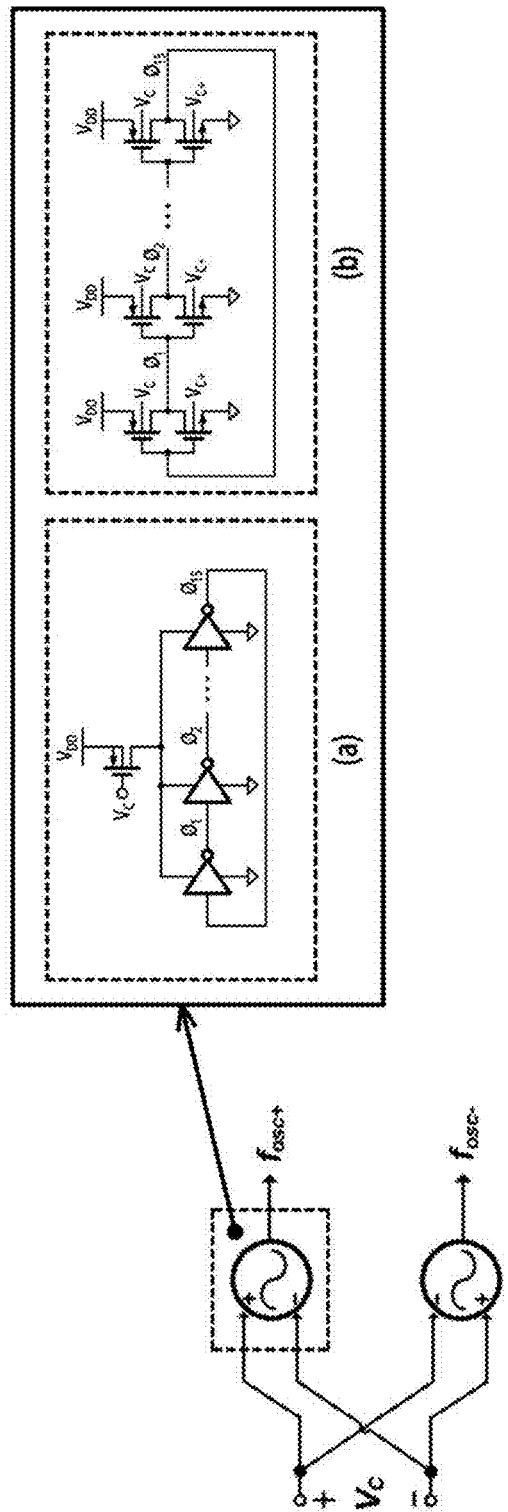
Figure 6C:
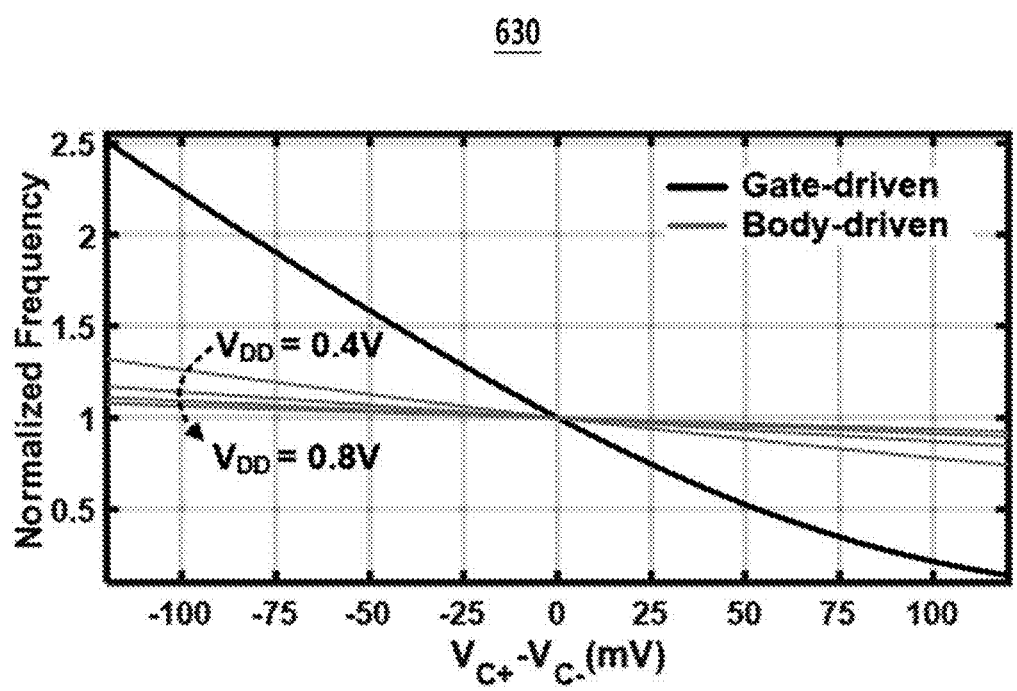

FIGS. 6A to 6C illustrate in more detail a quantizer according to an example embodiment.

Referring to FIGS. 6A to 6C, reference numeral 610 illustrates a block diagram of a secondary delta-sigma ADC according to an example embodiment that includes a body-driven VCO-based quantizer.

Also, (a) of reference numeral 620 illustrates an existing gate-driven VCO, and (b) of reference numeral 620 illustrates a body-driven VCO according to an example embodiment.

Also, reference numeral 630 illustrates simulation results for the tuning linearity of the gate-driven VCO and the body-driven VCO.

According to reference numerals 610 and 620, a secondary delta-sigma ADC provided to a current-to-digital converter according to an example embodiment may reduce quantization noise in the band of interest through an oversampling and noise-shaping process, unlike a Nyquist rate ADC, such as flash or a SAR ADC. In the case of using a significantly large oversampling rate (OSR), the quantization noise may be distributed over the oversampled frequency band, while a total amount may be maintained constantly. Also, the quantization noise in the band of interest may be further reduced by providing higher shaping order using a multi-loop filter.

Therefore, the secondary delta-sigma ADC may implement a desired high-resolution characteristic at kHz bandwidth and is implemented as a continuous time delta-sigma circuit and thus, a large anti-aliasing filter is not required.

In detail, the quantizer according to an example embodiment refers to a quantizer based on the body-driven VCO, rather than the existing gate-driven VCO, and may generate a second output signal corresponding to a first output signal based on an operation of the body-driven VCO that receives the first output signal output from an integrator based on a local feedback structure and may generate a first digital output code $(D_{AC\_OUT})$ corresponding to the second output signal based on an operation of a frequency-to-digital converter (FDC) that receives the second output signal.

In the existing gate-driven VCO shown in (a) of reference numeral 620, a change in an output frequency occurs due to a delay change of each inverter delay-cell and this delay change is caused by a change in current of a positive channel metal-oxide semiconductor (PMOS) transistor.

Here, an input voltage $(V_C)$ of the gate-driven VCO is applied to a gate terminal of the PMOS transistor and a gate transconductance $(G_m)$ characteristic of the PMOS transistor greatly affects a linearity characteristic of the gate-driven VCO. That is, since $G_m$ of the PMOS transistor has a non-linear characteristic, the change in the output frequency for the input voltage of the gate-driven VCO has a non-linear characteristic.

On the contrary, unlike the existing gate-driven VCO, in the body-driven VCO shown in (b) of reference numeral 620, an input voltage $(V_{C+}, V_{C-})$ is applied to a body terminal of the inverter delay-cell and accordingly, a delay change of the inverter delay-cell occurs due to a change in a threshold voltage of each of a PMOS transistor and an NMOS transistor constituting the inverter delay-cell due to a change in a body voltage.

That is, a change in an output frequency compared to an input voltage of the body-driven VCO according to an example embodiment occurs due to a body transconductance $(G_{mb})$ characteristic of each transistor. Since $G_{mb}$ has a linear characteristic compared to $G_m$, the body-driven VCO according to an example embodiment may secure more linear characteristics than the existing gate-driven VCO.

In this regard, according to reference numeral 630, it can be seen that $K_{VCO}$ of the body-driven VCO shows more linear characteristics than the existing gate-driven VCO using the gate transconductance $(G_m)$. Also, it can be seen that simulated harmonics of the quantizer based on the body-driven VCO are 77 dB and 64 dB for second and third harmonics, respectively, which are less than −110 dB for the third harmonic in input.

Figure 7:
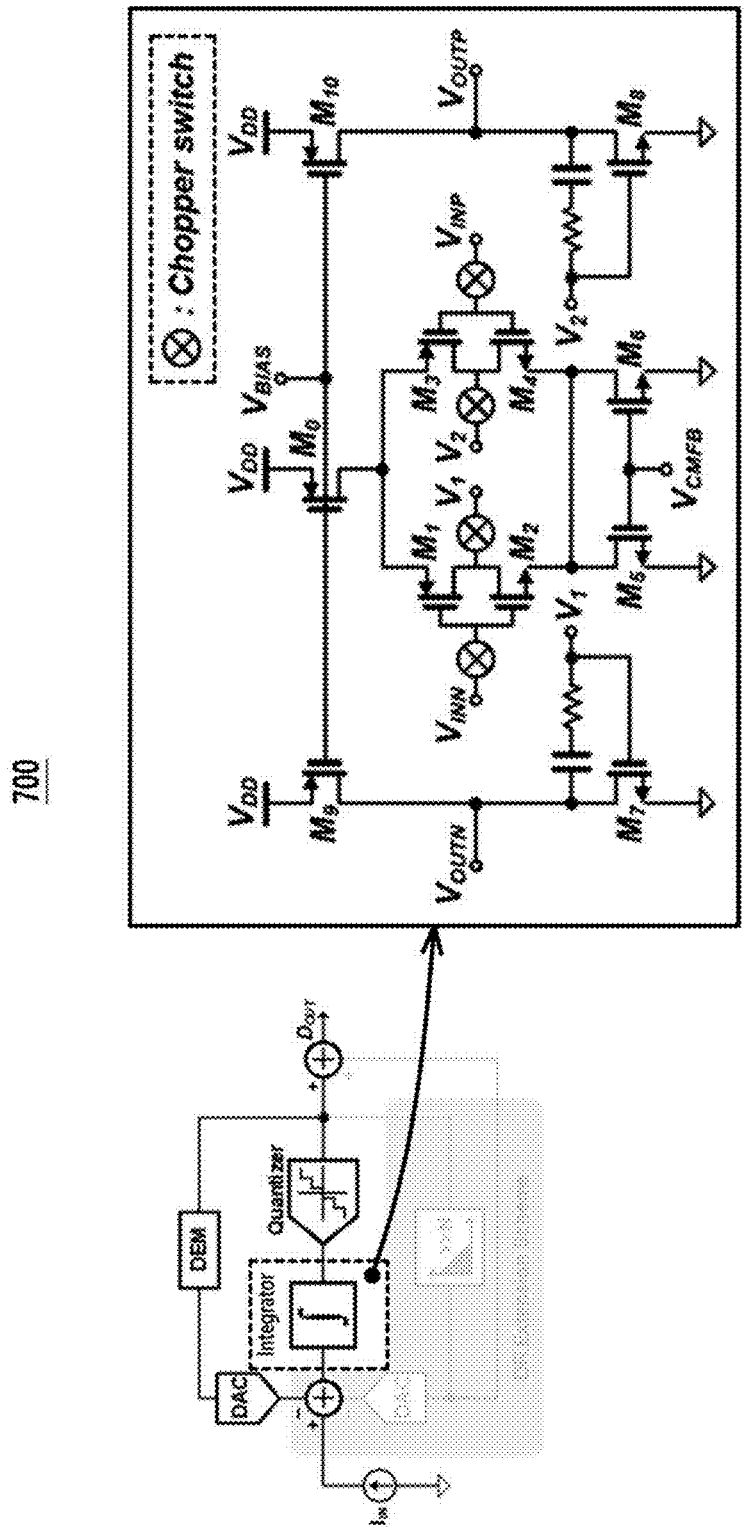
FIG. 7 illustrates in more detail an integrator according to an example embodiment.

FIG. 7 illustrates in more detail an integrator according to an example embodiment.

Referring to FIG. 7, reference numeral 700 illustrates an operational amplifier (i.e., chopped op-amp) that includes an input stage in which current provided to the integrator is recycled.

According to reference numeral 700, the integrator connected to a current source that outputs input current $(I_{IN})$ refers to an integrator based on a local feedback structure and may include an operational amplifier having a current-recycled input signal.

Noise of the operational amplifier that mostly includes flicker and thermal noise needs to be minimized since noise occurring in a first stage affects the entire system.

Therefore, in the integrator according to an example embodiment, the first stage of the operational amplifier may be truncated (i.e., chopped) to reduce a flicker noise section of 100 Hz or less and an input terminal may be implemented as a current-recycled stage to reduce thermal noise. Here, input reference thermal noise of the operational amplifier may be approximated as Equation 1 below.

$$S_{AMP}(f) \approx \frac{16}{3} \cdot \frac{kT}{g_{m1} + g_{m2}} \qquad \text{[Equation 1]}$$

Here, $g_m$ denotes transconductance of an input transistor.

That is, the operational amplifier according to an example embodiment may recycle current that operates between transistors $M_1$ to $M_4$, expanding the total transconductance of the input transistor in a subthreshold area. Therefore, the total input-reference current noise may be calculated to be integrated to 10 pArms across 4 kHz bandwidth.

Also, a total of 30 pArms of noise may flow into the operational amplifier along with noise of DAC and reference, which may represent a noise level of 475 fArms/√Hz, which is lower than a target noise level of 1 pArms/√Hz.

Figure 8:
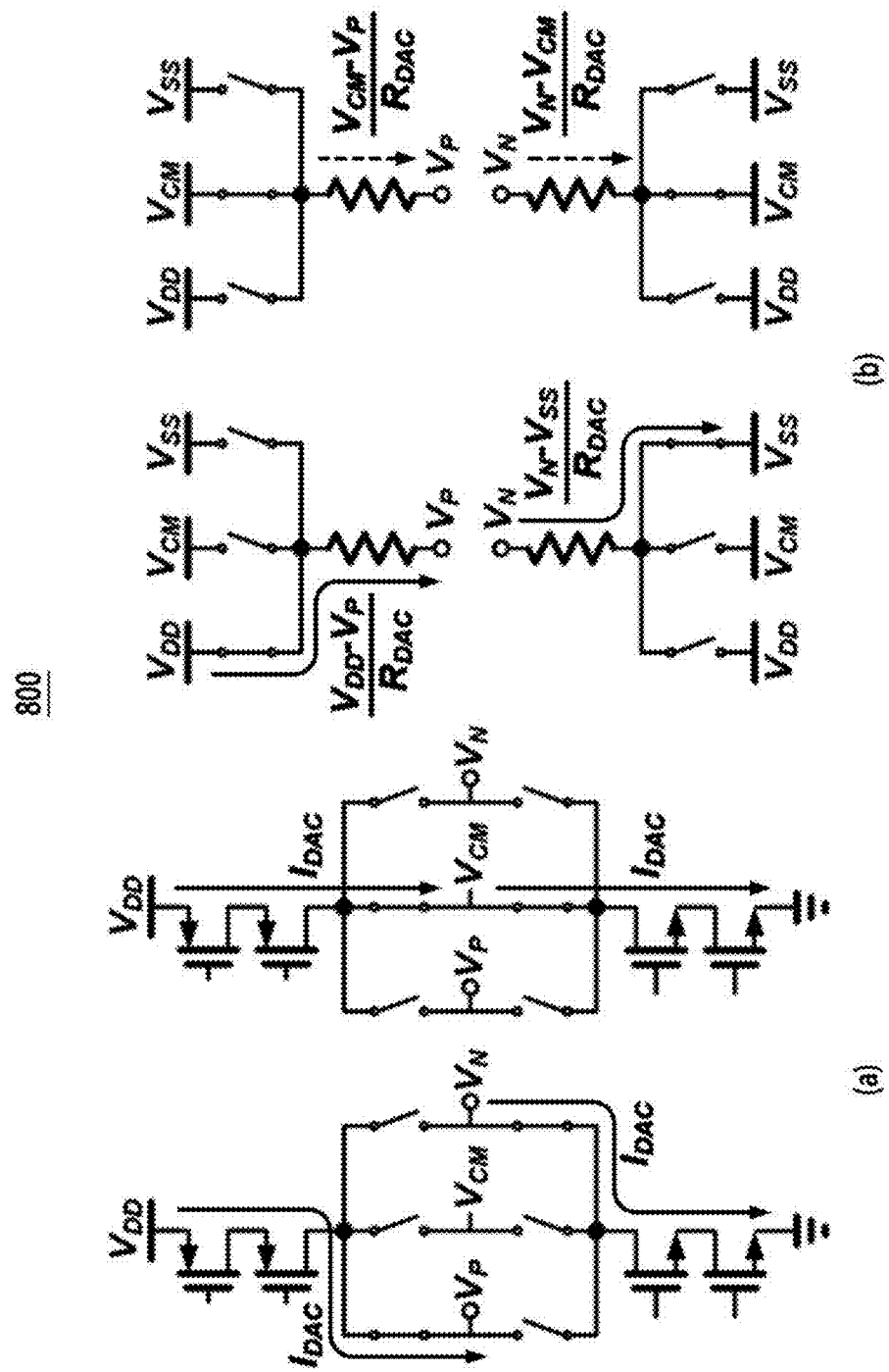
FIG. 8 illustrates in more detail a tri-level resistive digital-to-analog converter (RDAC) according to an example embodiment.
Figure 9A:
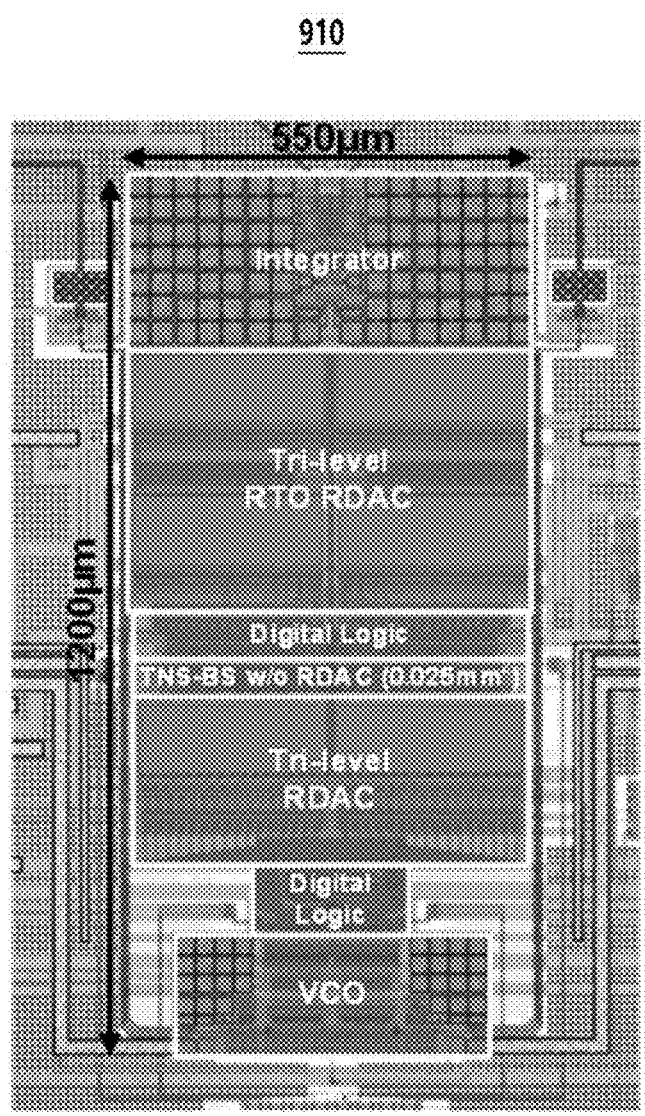
FIGS. 9A to 10B illustrate performance test results of a current-to-digital converter according to an example embodiment.
Figure 9B:
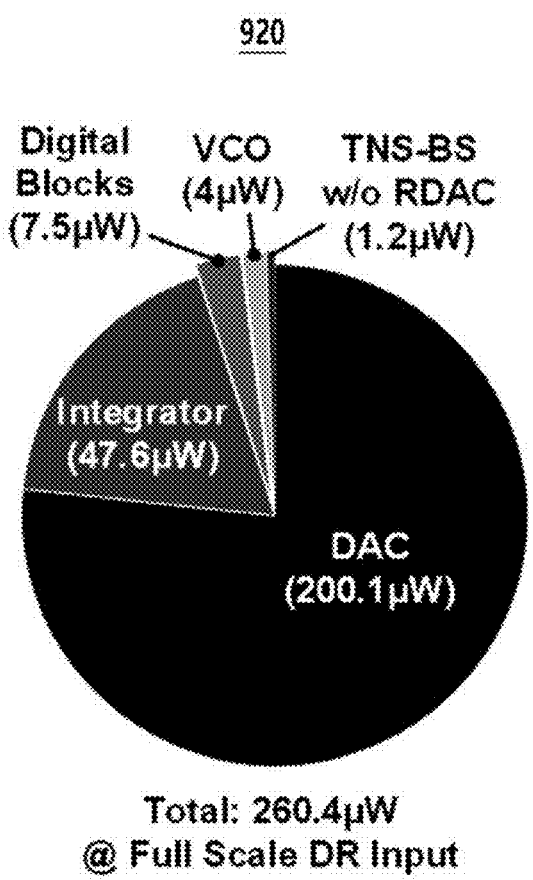
Figure 10A:
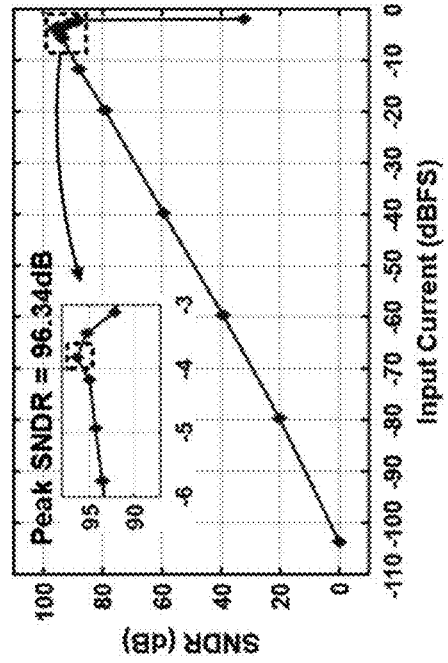
Figure 10A:
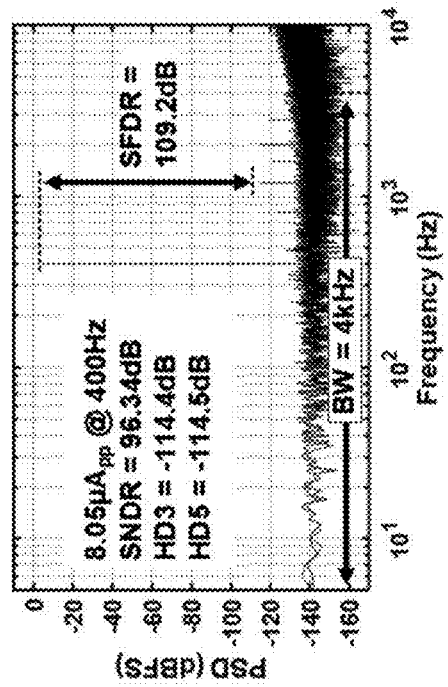
Figure 10A:
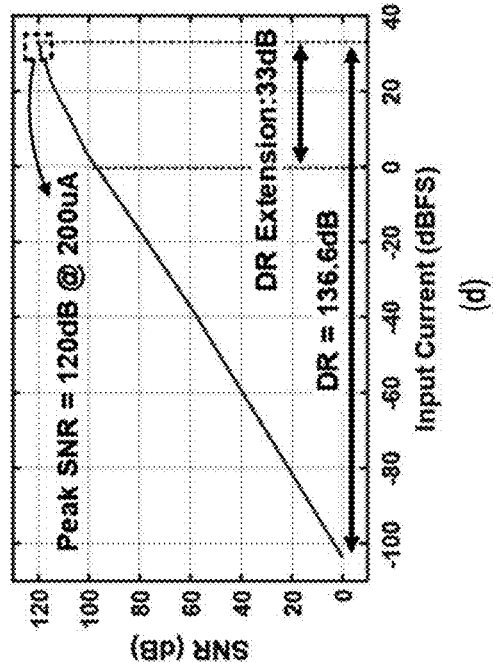
Figure 10A:
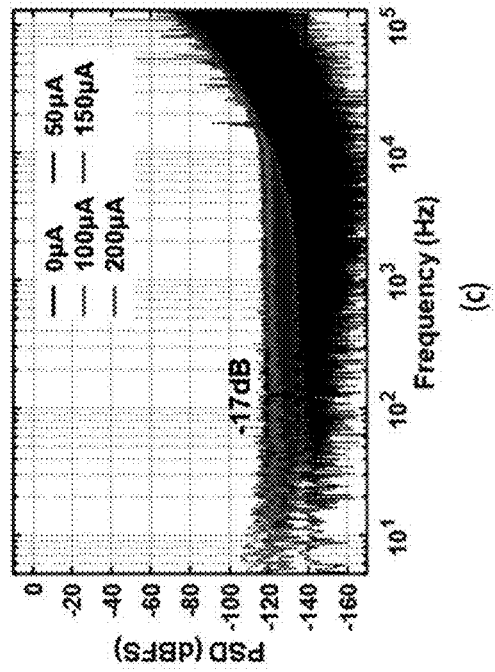
Figure 10B:
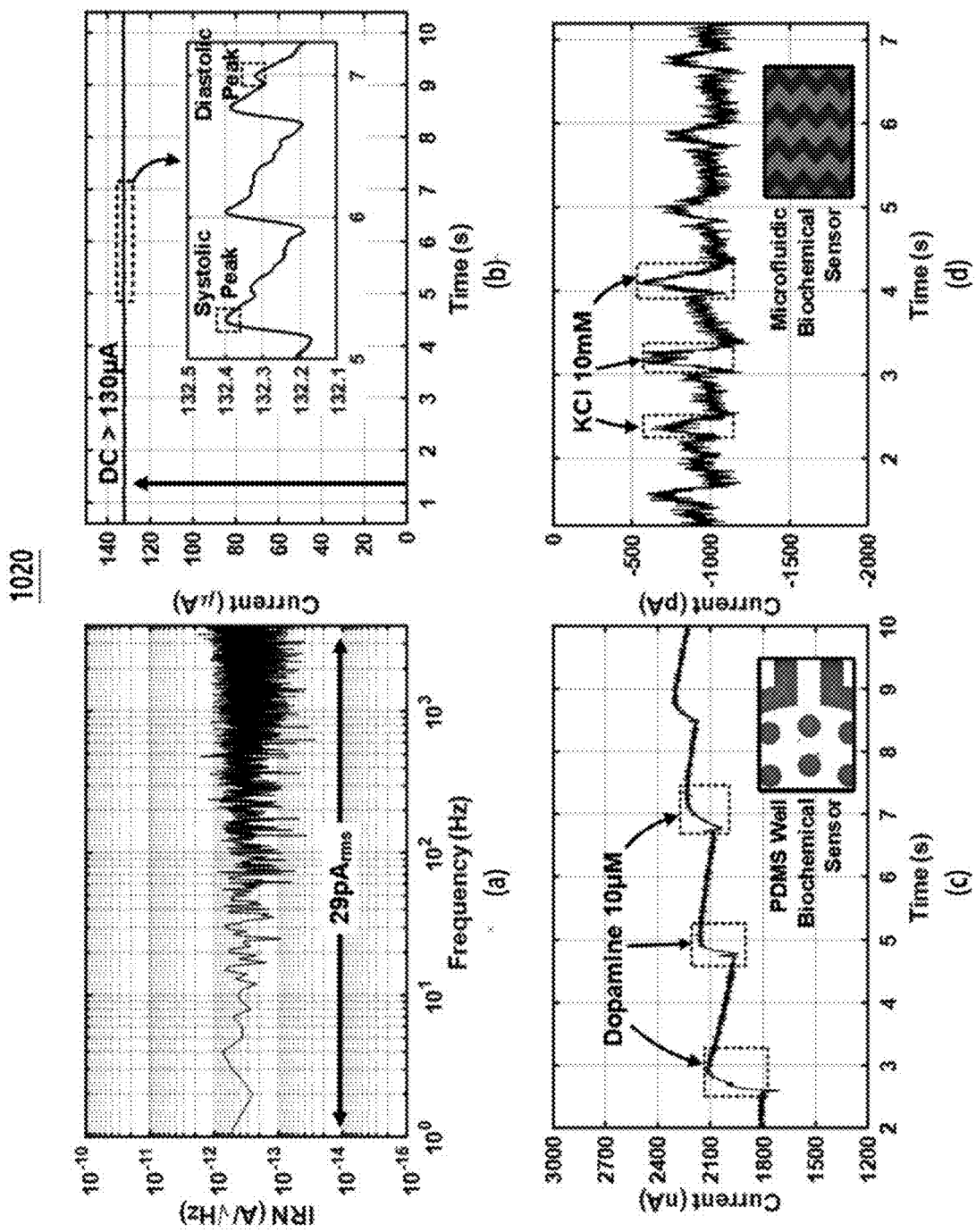

FIG. 8 illustrates in more detail a tri-level RDAC according to an example embodiment.

Referring to FIG. 8, (a) of FIG. 8 illustrates tri-level $I_{DAC}$s (current DACs) and (b) of FIG. 8 illustrates tri-level $R_{DAC}$s.

In detail, a closed-loop system may greatly vary depending on a characteristic of a feedback block, which also applies to a feedback DAC of a secondary delta-sigma (ΔΣ) ADC according to an example embodiment.

Since a feedback design affects the system in terms of noise, linearity, and power consumption, a careful design is required for a DAC. Since a capacitive DAC generates a pulsating wave at an input node and requires more stringent amplifier slew requirements, an $I_{DAC}$ and an $R_{DAC}$ are mainly used for a current input device.

However, since an unused DAC component consistently consume power while being connected to a common mode voltage ($V_{CM}$), the $I_{DAC}$ ((a) of FIG. 8) consumes the constant current of the $I_{DAC}$ regardless of digital output.

On the contrary, since feedback nodes $V_P$ and $V_N$ are maintained at bias of $V_{CM}$ and accordingly, no voltage drop occurs, the $R_{DAC}$ ((b) of FIG. 8) may ideally consume "zero" current when the DAC component is connected to $V_{CM}$ and the $R_{DAC}$ may produce less noise than using the $I_{DAC}$.

FIGS. 9A to 10B illustrate performance test results of a current-to-digital converter according to an example embodiment.

Referring to FIGS. 9A to 10B, reference numeral 910 illustrates a microscopic captured image of a current-to-digital converter implemented as a chip and reference numeral 920 illustrates power analysis results of a current-to-digital converter implemented as a chip.

Also, (a) of reference numeral 1010 illustrates power spectral density (PSD) measurement results of the current-to-digital converter for sinusoidal current input, (b) of reference numeral 1010 illustrates signal-to-noise and distortion ratio (SNDR) measurement results of the current-to-digital converter for sinusoidal current input, (a) of reference numeral 1010 illustrates PSD measurement results for various DC (0 μA to 200 μA) inputs, and (d) of reference numeral 1010 illustrates SNDR measurement results of the current-to-digital converter for various DC inputs.

Also, (a) of reference numeral 1020 illustrates measurement results of input reference noise in the current-to-digital converter, (b) of reference numeral 1020 illustrates photoplethysmography (PPG) measurement results in the current-to-digital converter when a large DC component is present, (c) of reference numeral 1020 illustrates dopamine measurement results when the current-to-digital converter is applied to a PDMS biochemical sensor, and (d) of reference numeral 1020 illustrates measurement results of potassium chloride (KCl) when the current-to-digital converter is applied to a microfluidic biochemical sensor.

According to reference numerals 910 and 920, the current-to-digital converter according to an example embodiment implemented through a 0.18 μm standard complementary metal-oxide semiconductor (CMOS) process occupies the space of 0.66 mm² and consumes the maximum power of 260.4 μW at full-scale reference current (~200 μA) at 1V supply voltage.

Also, the power consumption of the current-to-digital converter is less than 70 μW at zero reference current and more particularly, analysis shows that a truncation-noise-shaped baseline-servo (TNS-BS) loop occupies 0.025 mm² (~3.8%) and consumes the power of 1.2 μW (~0.46%).

According to reference numeral 1010, when applying a sinusoidal current (i.e., sine current) input of 8.05 μApp at 1V supply voltage, the SNDR performance of 96.34 dB and the SFDR performance of 109.2 dB are measured in the bandwidth of 4 kHz.

Also, when applying a variety of DC, it can be seen that the dynamic range includes a total of 136.6 dB and the dynamic range is extended by 33 dB from the ADC full-scale through the truncation-noise-shaped baseline-servo (TNS-BS) loop.

According to reference numeral 1020, the integrated noise of the current-to-digital converter is 29 pArms in the bandwidth of 4 kHz, which corresponds to the spectral density of 456 fArms/√Hz.

Also, as a result of collecting PPG signals with visible systolic and diastolic peaks at a large baseline of 130 μA or more based on the current-to-digital converter, measuring an amperometric response to continuous injection of 10 μM dopamine solution using a PDMS well-based biochemical sensor, and measuring the ionic current of 10 mM potassium chloride (KCl) solution injected with a microfluidic syringe pump using a microfluidic sensor, the current-to-digital converter successfully records a target signal despite the large reference component and wide signal range.

Meanwhile, performance comparison results between the current-to-digital converter (Proposed) according to an example embodiment and existing technologies (Conventional 1: applying prediction DAC, Conventional 2: applying current-splitting DAC, Conventional 3: applying threshold filter loop) are as shown in the following Table 1.

TABLE 1

| Parameters | Conventional 1 | Conventional 2 | Conventional 3 | Proposed |
| --- | --- | --- | --- | --- |
| Technology [nm CMOS] | 180 | 180 | 180 | 180 |
| Supply voltage [V] | 1.8 | 1.8 | 1.2/3.3 | 1.0 |
| Area [mm]² | 0.2[1] | 0.11 | >1 | 0.66 |
| Power [μW] | 295 | 50.3 | 28[3] | 64.1[3] |
| | | | | 260.4[3] |
| Bandwidth [Hz] | 1.8 k | 10 | 20 | 4 k |
| Resolution [pA]$_{rms}$ | 100 | 0.123 | 40 | 29 |
| IRN [fA$_{rms}$/√Hz] | 2300 | 39 | 8922 | 456 |
| MAX. input [μA] | 10 | 1.1 | 200 | 200 |
| SNDR [dB] | N.A. | 78.2 | 87.0 | 96.3 |
| SFDR [dB] | N.A. | 71.8 | 96.0 | 109.2 |
| DR expansion method | Prediction DAC | Current-splitting DAC | Threshold filter loop | TNS-BS loop |

TABLE 1-continued

| Parameters | Conventional 1 | Conventional 2 | Conventional 3 | Proposed |
|---|---|---|---|---|
| DR [dB] | 100 | 139 | 134 | 136.6 |
| $FOM_{DR}$ [dB] | 167 | 192 | 192.5[3] | 208.5[4] |
| $FOM_W$ [fJ/conv.] | 1002.3 | 345.0 | 170.8[3] | 5.9[4] |

According to Table 1, the current-to-digital converter according to an example embodiment achieves the best-in-class dynamic range of 136.6 dB in the bandwidth of 4 kHz while operating at the minimum supply voltage of 1V and, particularly, consumes a total of 260.4 μW at full scale and consumes 64.1 μW at peak SNDR input, and achieves the highest full-scale range compared to the existing technology.

While the example embodiments are described with reference to specific example embodiments and drawings, it will be apparent to one of ordinary skill in the art that various changes and modifications in form and details may be made in these example embodiments from the description. For example, suitable results may be achieved if the described techniques are performed in a different order, and/or if components in a described system, architecture, device, or circuit are combined in a different manner, or replaced or supplemented by other components or their equivalents.

Therefore, other implementations, other example embodiments, and equivalents of the claims are to be construed as being included in the claims.

EXPLANATION OF SYMBOLS

200: Current-to-digital converter
210-1: Integrator
210-2: Quantizer
210-3: Adder
220-1: First RDAC
220-2: DEM circuit
230-1: Second RDAC
230-2: TNS-LPF circuit

What is claimed is:

1. A current-to-digital converter comprising:
an integrator connected to a current source that outputs input current;
a quantizer connected to the integrator and configured to generate a first digital output code corresponding to alternating current (AC) in the input current;
a first loop circuit formed on a delta-sigma (ΔΣ) loop that connects an input terminal of the integrator and an output terminal of the quantizer;
a second loop circuit formed on a truncation-noise-shaped baseline-servo (TNS-BS) loop that connects the input terminal of the integrator and the output terminal of the quantizer and configured to generate a second digital output code corresponding to direct current (DC) in the input current; and
an adder configured to generate a final digital output code by adding the first digital output code and the second digital output code.

2. The current-to-digital converter of claim 1, wherein the first loop circuit includes a first resistive digital-to-analog converter (RDAC) connected to the input terminal of the integrator, a dynamic-element-matching (DEM) circuit connected to the first RDAC and the output terminal of the quantizer, and a first decoder connected to the first RDAC.

3. The current-to-digital converter of claim 2, wherein the first RDAC is a tri-level RDAC and the first decoder is a tri-level decoder.

4. The current-to-digital converter of claim 1, wherein the second loop circuit includes a second RDAC connected to the input terminal of the integrator and a truncation-noise-shaped low pass filtering (TNS-LPF) circuit connected to the second RDAC and the output terminal of the quantizer.

5. The current-to-digital converter of claim 4, wherein the TNS-LPF circuit includes a second decoder connected to the second RDAC, a $1^{st}$ order digital truncator connected to the second decoder, and a digital integrator connected to the $1^{st}$ order digital truncator and the output terminal of the quantizer, and is configured to output the second digital output code through an output node provided between the second decoder and the $1^{st}$ order digital truncator.

6. The current-to-digital converter of claim 5, wherein the second RDAC is a tri-level reset-then-open RDAC (RTO-RDAC), and the second decoder includes a tri-level decoder and a reset-then-open (RTO) logic.

7. The current-to-digital converter of claim 1, wherein the integrator is an integrator based on a local feedback structure.

8. The current-to-digital converter of claim 1, wherein the quantizer is a body-driven voltage-controlled oscillator (VCO)-based quantizer.

9. The current-to-digital converter of claim 1, wherein the first loop circuit is connected to the output terminal of the quantizer and thereby, connected to a second node provided at an output terminal of a subtractor that outputs the first digital output code to the adder, and
the second loop circuit is connected to a first node provided between the output terminal of the quantizer and an input terminal of the subtractor.

* * * * *